United States Patent [19]

den Boer et al.

[11] Patent Number: 5,414,283
[45] Date of Patent: May 9, 1995

[54] TFT WITH REDUCED PARASITIC CAPACITANCE

[75] Inventors: Willem den Boer; Mohshi Yang, both of Troy, Mich.

[73] Assignee: OIS Optical Imaging Systems, Inc., Troy, Mich.

[21] Appl. No.: 154,713

[22] Filed: Nov. 19, 1993

[51] Int. Cl.⁶ .................... H01L 27/01; H01L 27/13; H01L 29/78
[52] U.S. Cl. .................... 257/59; 257/72; 359/59
[58] Field of Search .................... 257/57, 59, 66, 72, 257/347, 401; 359/59

[56] References Cited

U.S. PATENT DOCUMENTS

| | | | |
|---|---|---|---|
| 3,405,330 | 10/1968 | Hilbiber | 318/718 |
| 3,413,531 | 11/1968 | Leith | 257/263 |
| 3,454,844 | 7/1969 | Dill | 257/366 |
| 3,492,548 | 1/1970 | Goodman | 257/66 |
| 3,675,091 | 7/1972 | Naomoto et al. | 257/488 |
| 3,787,962 | 1/1974 | Yoshida et al. | 437/29 |
| 3,862,360 | 1/1975 | Dill et al. | 348/792 |
| 4,112,333 | 9/1978 | Asars et al. | 345/90 |
| 4,159,561 | 7/1979 | Dingwall | 437/48 |
| 4,288,806 | 9/1981 | Ronen | 257/409 |
| 4,333,225 | 6/1982 | Yeh | 437/29 |
| 4,537,654 | 8/1985 | Berenz et al. | 437/22 |
| 4,654,117 | 3/1987 | Aoki et al. | 156/659.1 |
| 4,686,553 | 8/1987 | Possin | 257/60 |
| 4,689,116 | 8/1987 | Coissard et al. | 156/651 |
| 4,689,872 | 9/1987 | Appels et al. | 437/228 |
| 4,697,331 | 10/1987 | Boultrop et al. | 437/82 |
| 4,717,689 | 1/1988 | Maas et al. | 437/225 |
| 4,738,936 | 4/1988 | Rice | 437/141 |
| 4,762,398 | 8/1988 | Yasui et al. | 359/59 |
| 4,797,108 | 1/1989 | Crowther | 437/41 |
| 4,798,810 | 1/1989 | Blanchard et al. | 437/29 |
| 4,843,443 | 6/1989 | Ovshinsky et al. | 257/59 |
| 4,853,345 | 8/1989 | Himelick | 437/41 |
| 4,855,806 | 8/1989 | Parks et al. | 257/59 |
| 4,859,623 | 8/1989 | Busta | 437/48 |
| 4,862,234 | 8/1989 | Koden | 257/60 |
| 4,877,749 | 10/1989 | Quigg | 437/41 |
| 4,879,254 | 11/1989 | Tsuzuki et al. | 437/41 |
| 4,904,613 | 7/1990 | Coe et al. | 437/41 |
| 4,914,051 | 4/1990 | Huie et al. | 437/59 |
| 4,914,058 | 4/1990 | Blanchard | 437/203 |
| 4,949,141 | 8/1990 | Busta | 359/59 |
| 5,003,356 | 3/1991 | Wakai et al. | 257/390 |
| 5,047,819 | 9/1991 | Tanaka et al. | 257/350 |
| 5,051,800 | 9/1991 | Shoji et al. | 257/290 |
| 5,055,899 | 10/1991 | Wakai et al. | 257/61 |
| 5,058,995 | 10/1991 | Plus | 359/59 |
| 5,073,519 | 12/1991 | Rodder | 437/180 |

FOREIGN PATENT DOCUMENTS

| | | | |
|---|---|---|---|
| 60-65573 | 4/1985 | Japan | 257/59 |
| 60-192369 | 9/1985 | Japan | 257/72 |
| 64-82674 | 3/1989 | Japan | 257/59 |

*Primary Examiner*—Sara W. Crane
*Attorney, Agent, or Firm*—Myers, Liniak & Berenato

[57] ABSTRACT

A thin film transistor (TFT) array in an active matrix liquid crystal display (AMLCD) including a centrally located round source electrode substantially completely surrounded by a substantially annular or circular shaped drain electrode. The geometric design of the TFT of this invention provides for a thin film transistor having a reduced parasitic capacitance and decreased photosensitivity. The TFTs of this invention are located at the intersections of gate and drain lines of an active matrix LCD array thereby increasing the size of the pixel display openings of the matrix array.

22 Claims, 9 Drawing Sheets

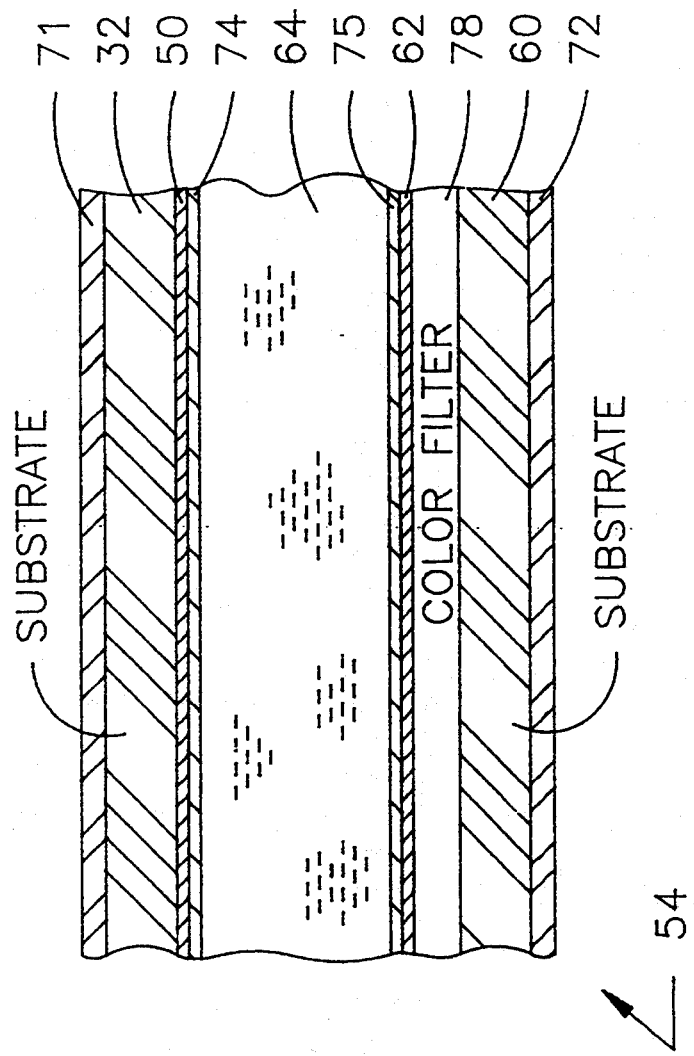

TFT WITH REDUCED PARASITIC CAPACITANCE

FIELD OF THE INVENTION

This invention relates to a TFT (thin film transistor) array in an active matrix liquid crystal display (AMLCD) having a plurality of TFTs arranged in the form of a matrix, each TFT including a gate electrode, a semiconductor film, a drain electrode, a source electrode, and a pixel electrode stacked on a transparent insulation substrate.

BACKGROUND OF THE INVENTION

Active matrix liquid crystal display devices are composed of a matrix of liquid crystal pixels arranged horizontally in rows and vertically in columns. The individual liquid crystal picture elements or pixels include first and second opposing polarizers, a liquid crystal material disposed between the polarizers, and transparent electrodes mounted on opposite sides of the liquid crystal material. Individual pixels of active matrix liquid crystal displays are more fully described in U.S. Pat. Nos. 4,632,514; 5,150,235; and 5,161,041, the disclosures of which are incorporated herein by reference.

Electronic matrix arrays find considerable application in active matrix liquid crystal displays. Such active matrix displays generally include X and Y address lines which are vertically and horizontally spaced apart and cross at an angle to one another thereby forming a plurality of crossover points. Associated with each crossover point is an element to be selectively addressed. These elements can be, for example, liquid crystal display pixels or the memory cells of an electronically addressable memory array.

Some form of isolation device (e.g. a thin film transistor) is generally associated with each array element or pixel. The isolation elements permit the individual elements or pixels to be selectively addressed by the application of suitable read potentials between respective pairs of the X and Y address lines.

Amorphous semiconductor thin film field effect transistors or TFTs have found wide usage for the isolation devices in such arrays. Thin film transistors formed from deposited semiconductors such as amorphous silicon alloys are ideally suited for such applications because they exhibit a very high dark resistivity and, therefore, have very low OFF state currents. The reverse leakage currents are so low that very high ON-to-OFF current ratios are made possible for effectively isolating the non-addressed array pixels from the pixels being addressed.

Structurally, thin film transistors (TFTs) generally include substantially co-planar source and drain electrodes, a semiconductor material between the source and drain electrodes, and a gate electrode in proximity to the semiconductor but electrically insulated therefrom by a gate insulator. Current flow through the thin film transistor between the source and drain is controlled by the application of a voltage to the gate electrode. The voltage to the gate electrode produces an electric field which accumulates a charged region near the semiconductor-gate insulator interface. This charged region forms a current conducting channel in the semiconductor through which the device current is conducted.

FIGS. 1 and 2 show a conventional linear-type thin film transistor used in conjunction with an active matrix liquid crystal display. Referring to FIGS. 1 and 2, a plurality (not shown) of TFTs 1 are arranged on a transparent insulating substrate 2 in the form of a matrix. Gate electrodes 3 of the thin film transistors 1 are connected by a gate line 4 extending in the row direction. Drain electrodes 5 of the thin film transistors 1 are connected by a drain line 6 extending in the column direction. A source electrode 7 of each thin film transistor 1 is connected to a transparent pixel electrode 8 independently formed in an area surrounded by the gate and drain lines 4 and 6. The pixel electrode 8 is the transparent electrode adjacent a liquid crystal layer which in conjunction with an opposing electrode on the other side of the liquid crystal layer selectively drives the liquid crystal pixel enabling respective polarizers to transmit or absorb light rays. An electrode, to which a data signal is supplied, will be referred to as a drain electrode hereinafter.

More specifically as shown in FIG. 2, the gate electrode 3 consisting of Cr or the like is formed on the transparent glass substrate 2, and a gate insulating film 9 consisting of silicon oxide or silicon nitride is formed on the upper surface of the glass substrate 2 including the upper surface of the gate electrode 3. A semiconductor film 10 consisting of amorphous silicon is stacked on the gate insulating film 9 above the gate electrode 3. Drain and source electrodes 5 and 7 are formed on the semiconductor film 10. The source and drain electrodes are separated from one another by a predetermined distance, forming channel portion 11. Drain and source electrodes 5 and 7 respectively have contact layers 5a and 7a, and metal layers 5b and 7b, and are electrically connected to the semiconductor film 10.

The source electrode 7 is connected to the transparent pixel electrode 8 consisting of Indium-Tin-Oxide (to be referred to as "ITO" hereinafter) which in turn leads to the pixel made up of a liquid crystal layer, opposing polarizers and opposing electrodes (one being pixel electrode 8).

The linear type thin film transistor of FIGS. 1 and 2, unfortunately, has a relatively high parasitic capacitance which tends to cause pixel flickering, image retention, and gray scale nonuniformity. The relatively high parasitic capacitance ($C_{GS}$) of the linear-type TFT shown in FIGS. 1 and 2 causes the pixel voltage across the liquid crystal material to drop by about 1–2 volts when the voltage signal to the gate electrode is shut off. The pixel voltage drop or shift is determined by the following equation:

$$\delta V_p = \frac{C_{gs}}{C_{gs} + C_{ST} + C_{LC}} \cdot \delta V_g$$

where $C_{ST}$ is the storage capacitance, which is added in parallel to the liquid crystal capacitance $C_{LC}$. The parameter $\delta V_g$ is the gate pulse height. $\delta V_p$ can be offset by adjusting the voltage on the counterelectrode (on the top plate) to get a substantially pure AC voltage across the liquid crystal material. However, because $C_{LC}$ depends upon the voltage across the liquid crystal material, $\delta V_p$ can generally not be offset for every gray level and, for large displays, cannot be offset over the entire display area. The residual DC component can lead to pixel flickering, image retention, gray scale nonuniformity and electrochemical degradation of the liquid crystal material.

As the parasitic capacitance of a TFT is decreased, the voltage drop and corresponding DC component across the liquid crystal pixel becomes smaller. Accordingly, the voltage drop across the pixel is proportional to the parasitic capacitance or $C_{GS}$ of the TFT. The relatively high voltage drop across the prior art pixel discussed above leads to flickering, image retention, and gray scale nonuniformity in the pixel display. Flickering results from a small DC component across the pixel electrodes spanning the liquid crystal layer. Accordingly, pure AC voltage across the pixel electrodes is ideal. By reducing the $C_{GS}$, or parasitic capacitance between the gate and source electrodes of a TFT, the DC component across the pixel electrodes of the prior art TFT of FIGS. 1 and 2 can be substantially eliminated or reduced, thereby greatly reducing pixel flickering, gray scale nonuniformity, image retention, and electrochemical degradation of the LC material.

Therefore, there exists a need in the art for a thin film transistor (TFT) having a reduced parasitic capacitance $C_{GS}$ for use in active matrix liquid crystal displays.

FIGS. 3 and 4 illustrate an attempt, described in U.S. Pat. Nos. 5,003,356 and 5,055,899, to reduce the parasitic or gate-source capacitance $C_{GS}$ present between the gate and source electrodes. The prior art open-ring thin film transistor of FIGS. 3 and 4 includes a gate electrode 11 formed on a glass substrate 12, and a gate insulating film 13 consisting of silicon nitride and having a thickness of about 3,000 Å stacked on the gate electrode 11. A semiconductor film 14 consisting of amorphous silicon (a-Si) is stacked on the part of the gate insulating film 13 which corresponds to the gate electrode 11. The a-Si layer 14 extends laterally at least to the lateral peripheral edges of the gate electrode 11. A partially circular source electrode 15 is formed on the semiconductor film 14. The source electrode 15 has a diameter of about 4 μm (micrometers).

A drain electrode 16 is formed in a semi-annular or half-circular shape on the semiconductor film 14 only partially surrounding the source electrode 15, thereby forming a semiconductor channel portion "L" in a partially annular space between the source and drain electrodes 15 and 16. Because the channel portion is formed so as to partially surround the source electrode 15, if the distance between the source and drain electrodes is a channel length L, and the length of an arc defined by substantially intermediate points of the channel length L is a channel width W, the channel width W is sufficiently larger than the channel length L. The channel length to width ratio is therefore less than one thereby providing for a reduced parasitic capacitance $C_{GS}$. The source electrode 15 is only partially surrounded by the drain electrode 16 because the source and drain electrodes are substantially coplanar and an opening is left in the drain 16 to allow the pixel electrode 19, 25 to extend into electrical contact with the source electrode 15. Furthermore, the open-ring design of the prior art TFT shown in FIGS. 3-4 is provided so as to not unduly limit the viewing display area of the arrayed pixels 19 thereby providing for a fairly large display area for each pixel. The drain electrode 16 of FIGS. 3-4 does not substantially completely surround the source electrode 15.

A plurality (not shown) of the open-ring TFTs 18 of FIGS. 3 and 4 each arranged in the above-described manner are, in the prior art, arrayed on a substrate 12 in the form of a matrix. The source electrode 15 of each thin film transistor 18 is connected to a pixel electrode 19 consisting of a transparent conductive substance such as ITO. Drain electrodes 16 of TFTs 18 arranged in the column direction are commonly connected to a drain line 20, while the gate electrodes 11 of thin film transistors 18 arranged in the row direction are commonly connected to a gate line 21 (each TFT therefore has a gate electrode 11 connected to a horizontally extending gate line 21 and a drain electrode 16 connected to a vertically extending drain line 20. In addition, a plurality (not shown) of pixel electrodes 19 connected to source electrodes 15 of TFTs 18 are arrayed above the glass substrate 12 in the form of a matrix.

A linear portion 25 of the transparent pixel electrode 19 passes through the opening in the semi-circular shaped drain electrode 16. Therefore, the pixel electrode (19, 25) does not cross over the drain electrode 16 but, instead, extends through the opening created in the drain 16. That is, the drain electrode 16 adjacent the linear portion 25 of the pixel electrode is removed so as to prevent an unnecessary electric field from being applied to the channel portion.

In the prior art open-ring TFT of FIGS. 3 and 4, the source electrode 15 is formed so as to be smaller in size than the drain electrode 16. Therefore, the area where the source and gate electrodes 15 and 11 overlap one another is considerably smaller than that where the drain and gate electrodes 16 and 11 overlap one another. Accordingly, the parasitic capacitance, or $C_{GS}$, between the gate and source electrodes is decreased.

While the open-ring geometric design of the prior art thin film transistor of FIGS. 3 and 4 does, in fact, reduce the parasitic capacitance between the gate and source electrodes, the open-ring thin film transistor of FIGS. 3-4 is not without its drawbacks. The prior art open-ring TFT is very photosensitive and the parasitic capacitance $C_{GS}$ of the open-ring TFT shown in FIGS. 3-4 has not been decreased as much as would be most preferably desired. Furthermore, the linear electrode portion 25 and the amorphous silicon semiconductor layer of this TFT are not completely shielded by the gate electrode from the backlighting scheme (not shown) by the gate, thus subjecting the thin film transistor of FIGS. 3-4 to undesirable photosensitivity with respect to the backlighting scheme (not shown) of the liquid crystal display which illuminates the pixels and TFTs from beneath the gate 11. In fact, FIG. 3 illustrates the edges of the semiconductor layer 14 extending beyond the edges of the gate electrode 11. Also, the ON current, an important parameter in determining how fast the pixel will charge up during the positive charging cycle, of this prior art open-ring transistor is undesirably low. Finally, the open-ring TFT shown in FIGS. 3 and 4 is located on the gate line 21, thereby reducing the display area of pixel electrode 19.

The aforesaid described prior art TFTs are very photosensitive, The reason for this high degree of photosensitivity is that the semiconductor a-Si layers are photosensitive and are not completely shielded by the prior art gate electrodes from the intense radiation of backlighting schemes because the prior art a-Si layers extend at least to the periphery of the gate electrodes.

It should be apparent to those skilled in the art that there exists a need in the art for a thin film transistor, in an active matrix liquid crystal display, having a reduced parasitic capacitance, a reduced photosensitivity, a high ON current, and positonable so as to enlarge the display areas of the pixel electrodes.

It is a purpose of this invention to fulfill the above-described needs, as well as other needs apparent to the skilled artisan from the following detailed description of this invention.

SUMMARY OF THE INVENTION

Generally speaking, this invention fulfills the above-described needs in the art by providing a pixel for use in a liquid crystal display, comprising: a layer of liquid crystal material sandwiched between two spaced substrates, each substrate having a pixel electrode mounted thereon, and wherein one of the pixel electrodes is electrically connected to a thin film transistor, the thin film transistor comprising:

a drain electrode adapted to be electrically connected to a drain line; a gate electrode adapted to be electrically connected to a gate line; and a source electrode substantially coplanar with at least a portion of said drain electrode and electrically connected to the one pixel electrode; wherein the source electrode is located on a semiconductor film and is substantially completely surrounded in substantially all lateral directions by the drain electrode.

In certain preferred embodiments of this invention, the thin film transistor further comprises a passivation insulating layer formed on an upper surface of at least one of the drain and source electrodes, and the one pixel electrode electrically connected to the source electrode is transparent and is adhered to and crosses over the passivation layer.

In certain further preferred embodiments of this invention the thin film transistor further comprises a gate insulating layer disposed between the semiconductor film and the gate electrode, wherein the gate insulating layer includes a silicon nitride layer about 2,000 Å thick and a TaO layer about 1,600 Å thick.

In still further preferred embodiments of this invention, the gate electrode, not including the gate line, has a larger horizontal surface area than the semiconductor layer.

This invention further fulfills the above-described needs in the art by providing in an active matrix liquid crystal display (AMLCD) comprising a plurality of thin film transistors arranged on an insulating substrate in the form of a matrix, one of the plurality of thin film transistors including a drain electrode electrically connected to a drain line, a gate electrode electrically connected to a gate line, and a source electrode electrically connected to a transparent pixel electrode of a corresponding pixel display, wherein the source and drain electrodes of said one thin film transistor are formed on a semiconductor film and separated from one another by a channel defining a predetermined length and width, the improvement comprising:

wherein the source electrode of the one thin film transistor is centrally located on the semiconductor film and is substantially completely surrounded laterally by the drain electrode.

In certain preferred embodiments of this invention, the drain electrode is substantially annular or circular defining an inner and an outer diameter, the source electrode is substantially round, and wherein the gate electrode is substantially round and has a diameter substantially larger than the inner diameter of the drain electrode thereby increasing the tolerance for misalignment of the source and drain electrodes relative to the gate electrode.

In further preferred embodiments of this invention, the gate line is arranged in a row direction, the drain line is arranged in a column direction substantially perpendicular to the gate line, and wherein the gate and drain lines intersect one another defining the pixel display area therebetween. In still further preferred embodiments of this invention, the thin film transistor is located at an intersection of the gate and drain lines thereby enlarging the size of the pixel display area.

In certain further preferred embodiments of this invention, a passivation layer is formed on an upper surface of at least one of the drain and source electrodes, wherein the transparent pixel electrode electrically connected to the source and the pixel display is adhered to and crosses over the passivation layer, and wherein the pixel electrode consists essentially of Indium-Tin-Oxide (ITO) and the passivation layer consists essentially of one of: silicon nitride, silicon oxide, and combinations thereof. In certain other preferred embodiments of this invention, the channel is ringed shaped and has a channel length of about 6 micrometers and the diameter of the source being about 8 micrometers.

In certain other preferred embodiments of this invention, the semiconductor film consists essentially of amorphous silicon and is about 2,000 Å thick.

This invention will now be described with reference to certain embodiments thereof as illustrated in the following drawings.

IN THE DRAWINGS

FIG. 12 is a cross sectional view of a liquid crystal display pixel to be selectively controlled by a TFT of this invention.

DETAILED DESCRIPTION OF CERTAIN EMBODIMENTS OF THIS INVENTION

Particular embodiments of thin film transistors (TFTs) according to this invention will now be described with reference to the accompanying drawings.

Figure 5:
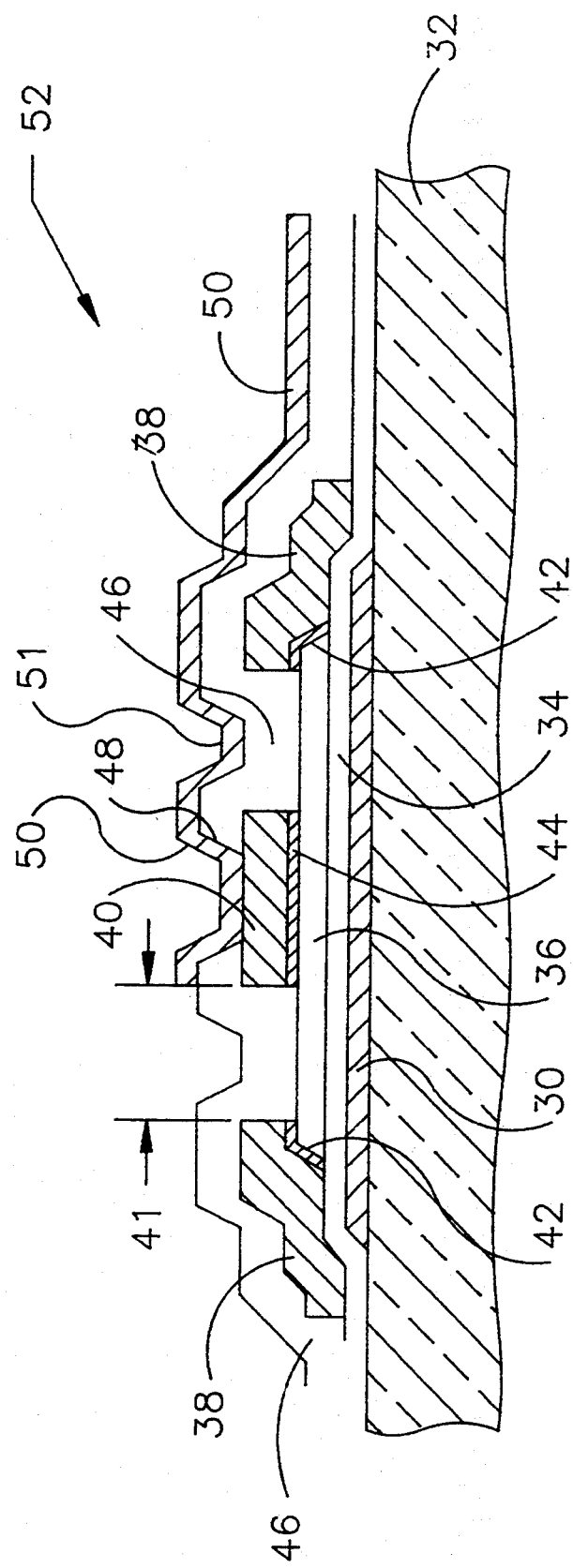
FIG. 5 is a cross-sectional view of a first embodiment of the thin film transistor according to the instant invention, illustrating the centrally located source electrode and the annular or circular drain electrode completely surrounding the central source electrode.

FIG. 5 is a cross-sectional side view illustrating a first embodiment of the ring-shaped thin film transistor of this invention. Gate electrode 30 consisting of either chromium (Cr), aluminum (Al), tantalum (Ta), or combinations thereof, and having a thickness of about 1,000-5,000 Å (most preferably about 2,500 Å) is formed on an insulating substrate 32 preferably consisting essentially of a transparent glass plate. A gate insulating film 34 having a thickness of about 3,000-4,000 Å (most preferably about 3,600 Å) is formed on the upper surface of the insulating glass substrate 32 including the upper surface of the gate electrode 30. The gate insulating film 34 is made of, for example, silicon nitride, silicon oxide, tantalum oxide, or combinations thereof. This gate insulating film 34 may include two layers (not shown), one of, for example, silicon nitride, and the other of tantalum oxide. If made of two layers, each gate insulating film layer most preferably has a thickness of about 1,500-2,000 Å.

A semiconductor film 36 consisting essentially of, for example, amorphous silicon (a-Si) and having a thickness of about 1,000-3,000 Å (most preferably about 2,000 Å) is formed on the gate insulating film 34, above and covering a portion above the gate electrode 30 as shown in FIG. 5. The edges of the semiconductor layer 36 do not extend to the lateral periphery of the gate electrode 30. The diameter of the a-Si semiconductor layer is substantially less than the diameter of the gate electrode thereby reducing the photosensitivity of the TFT of this embodiment.

Circular or annular shaped drain electrode 38 and centrally located source electrode 40 are formed on the semiconductor film 36. The centrally located source electrode 40 is preferably substantially round, and is substantially completely surrounded by the annular drain electrode 38. The source and drain electrodes, 40 and 38, are separated from each other by a predetermined distance that forms a channel length portion 41.

In order to electrically connect the drain and source electrodes 38 and 40 to the amorphous silicon semiconductor film 36, the drain and source electrodes 38 and 40 are provided with contact films 42 and 44 respectively. Each contact film 42 and 44 preferably consists essentially of one layer preferably made of amorphous silicon doped with an impurity (e.g. phosphorous) in a high concentration and having a thickness of about 500 Å. Each electrode 38 and 40 is preferably made of a conductive metal material such as chromium. The drain and source electrodes themselves may be about 1,000-5,000 Å thick but most preferably are about 4,000 Å thick. As a result of the reduced surface area of the semiconductor layer 36, a portion of the drain electrode 38 is substantially coplanar with the source electrode 40, while another portion of the drain is not.

A passivation and insulating layer 46 made of silicon nitride, silicon oxide, or any other suitable material is preferably deposited on substantially the entire exposed surface above the insulating substrate 32 on which the above-described films have been stacked in a predetermined form. The passivation layer 46 preferably extends over the matrix array including the pixel, and the gate and drain lines, and has openings only for the thru-holes 48. Alternatively, the passivation layer may have an opening for the pixels 54. The substantially annular drain electrode 38 is preferably completely covered with the passivation insulating film 46 and is thereby insulated from the other electrodes. The thickness of the passivation layer or film 46 on the drain and source electrodes 38 and 40 is about 2,000-8,000 Å (most preferably about 3,000 Å). The passivation film 46 protects and passivates the TFT channel 41 and electrically isolates the electrodes. The layer 46 fills in recesses generated upon formation of the above-described thin films, thereby substantially smoothing the surface above the insulating substrate 32. The thickness of the passivation film may be constant as illustrated in FIG. 5 or may vary so as to provide for a substantially smoother upper surface thereof. The presence of the passivation insulating layer 46 allows the formation of a bridge over the channel and the drain electrode 38, wherein the pixel electrode crosses the bridge formed over the closed ring.

A thru-hole 48 extending through the passivation film 46 is formed in a portion of the passivation film 46 above the source electrode 40. A transparent pixel electrode 50 electrically connected to the pixel display and consisting essentially of, for example, ITO and having a thickness of about 1,000 Å is formed on the upper surface of the passivation layer or film 46. The transparent pixel electrode 50 extends into the thru-hole 48 and hence is electrically connected to the source electrode 40 thereby conductively connecting the source electrode 40 to the pixel. A portion 51 of the transparent pixel electrode 50 crosses over the channel portion 41 of the semiconductor film 36 formed between the drain and source electrodes 38 and 40. The portion 51 of the transparent pixel electrode crossing over the channel 41 forms a top gate transistor more fully described below and schematically illustrated in FIG. 11. Due to the presence of the passivation layer 46, the portion of the pixel electrode 50 disposed above the gate electrode 30 is generally not coplanar with either the source or drain electrodes.

If the thickness of the passivation and insulating film 46 formed on the drain and source electrodes 38 and 40 is excessively small, the passivation and insulating properties of the TFT are degraded. In contrast to this, if the thickness of the film 46 is excessively large, electrical connection between the source electrode 40 and the pixel electrode 50 through thru-hole 48 becomes rather difficult. Accordingly, the thickness of the passivation layer 46 preferably falls within the range of about 2,000-8,000 Å. Furthermore, as the thickness of the passivation layer 46 becomes larger, the significance and effect of the top gate transistor formed by crossover portion 51 is reduced.

In the thin film transistor of FIG. 5 having the above-described structure, because the passivation insulator layer 46 is formed on the drain electrode 38 and part of the source electrode 40, the pixel electrode 50 is provided with a bridge over the drain electrode and the channel 41, and furthermore, the probability of short circuiting between the drain and source electrodes 38 and 40 is considerably decreased.

With reference again to FIG. 5, it will now be explained how the first embodiment of the TFT according to this invention shown in FIGS. 5–7, 10, and 11 is manufactured.

As shown in FIG. 5, the gate electrode 30 consisting essentially of a metal film (e.g. chromium) having a thickness of about 1,000–5,000 Å, most preferably about 2,500 Å, is deposited by means of sputtering or vapor deposition on the cleaned top surface of a transparent insulating substrate 32. The metal film 30 is then patterned by photolithography or the like to form the gate electrode 30. The insulating transparent substrate 32 may be made of glass, quartz, sapphire, or the like. The gate electrode 30 may consist essentially of, for example, chromium, titanium, tungsten, tantalum, copper, aluminum, combinations thereof, or the like.

The gate insulating film 34 is then formed on the surface of the insulating substrate 32 by plasma enhanced chemical vapor deposition (CVD) or the like so as to have a thickness of about 3,000–4,000 Å and cover the gate electrode 30. A silicon nitride film, silicon oxide film, tantalum oxide film or combinations thereof may be used as the gate insulating film 34.

Subsequently, the semiconductor film 36 made of amorphous silicon or the like and the contact films 42 and 44 made of amorphous silicon doped with an impurity at high concentration (e.g. about 1% phosphorous) are continuously formed or stacked by plasma chemical vapor deposition or the like onto the gate insulating film 34 so as to have thicknesses of, for example, about 2,000 Å and about 500 Å respectively. The semiconductor film 36 and the contact films 42 and 44 are patterned by photolithography or the like so as to cover a portion above the gate electrode 30. Instead of the above mentioned amorphous silicon, amorphous silicon carbide (SIC), tellurium, selenium, gerumanium, cadmium sulfide (CdS), cadmium selenide (CdSe), or the like may be used as a material for semiconductor film 36 and contact films 42 and 44.

A relatively thick metal film having a thickness of about 1,000–5,000 Å (most preferably about 4,000 Å) is then formed on the entire surface extant by vapor deposition, sputtering, or the like, thus covering the contact films 42 and 44. This metal film is then patterned by photolithography, etching, or the like to remove the film and contact films 42 and 44 at the channel portion 41, thereby forming the drain and source electrodes 38 and 40 above the gate electrode 30, which are separated from each other by a predetermined channel length distance 41, as shown in FIG. 5. Chromium, titanium, tungsten, tantelum, copper, aluminum, molybdenum, or the like may be used as a material for the metal films of the drain and source electrodes 38 and 40.

Next, the passivation insulating film 46 is formed on and over the insulating substrate 32, preferably covering substantially at least the drain electrode 38 and source electrode 40, but preferably covering the entire surface area. The passivation layer 46 may be formed of, for example, silicon nitride, a polyimide, or silicon oxide, and is preferably deposited via plasma enhanced chemical vapor deposition. The thickness of the passivation layer 46 on the drain and source electrodes is preferably about 2,000–8,000 Å. However, the portion 51 of the film 46 covering the channel 41 may have an increased thickness with respect to the portion covering the electrodes so as to reduce the effect of the parasitic top gate transistor formed by the crossover portion 51 of the pixel electrode 50 over the channel 41. This increased thickness may be achieved via adjustments in the coating process. Thereafter, the thru-hole 48 is formed in the passivation insulator film 46 above a portion of the source electrode 40 by etching or the like.

Finally, the transparent pixel electrode 50 made of a material such as ITO, tin oxide, or Indium oxide is then sputtered and patterned on the top surface of the passivation film 46 including the thru-hole 48 to a thickness of about 1,000 Å. With the above-described process, fabrication of the thin film transistor of this embodiment of this invention is completed.

Accordingly, the parasitic capacitance $C_{GS}$ of the thin film transistor of this embodiment is improved due to the geometric design of the TFT wherein the drain electrode substantially laterally surrounds the source electrode. By reducing the $C_{GS}$, small DC components across the pixel (between the opposing pixel electrodes) are reduced thereby substantially reducing flicker, image retention, and gray scale nonuniformity in the pixel.

Figure 6:
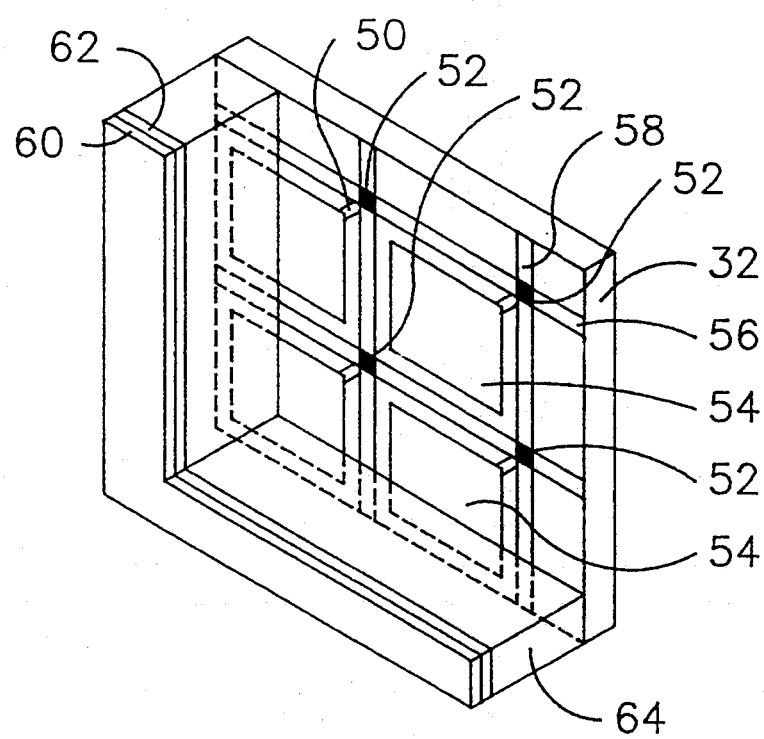
FIG. 6 illustrates an active matrix liquid crystal display in combination with the first embodiment of the thin film transistor of this invention, particularly illustrating the gate and drain lines respectively electrically coupled to the gate and drain electrodes of the TFT of FIG. 5, and the pixel electrode electrically coupled to the source of the TFT of FIG. 5.
Figure 7:
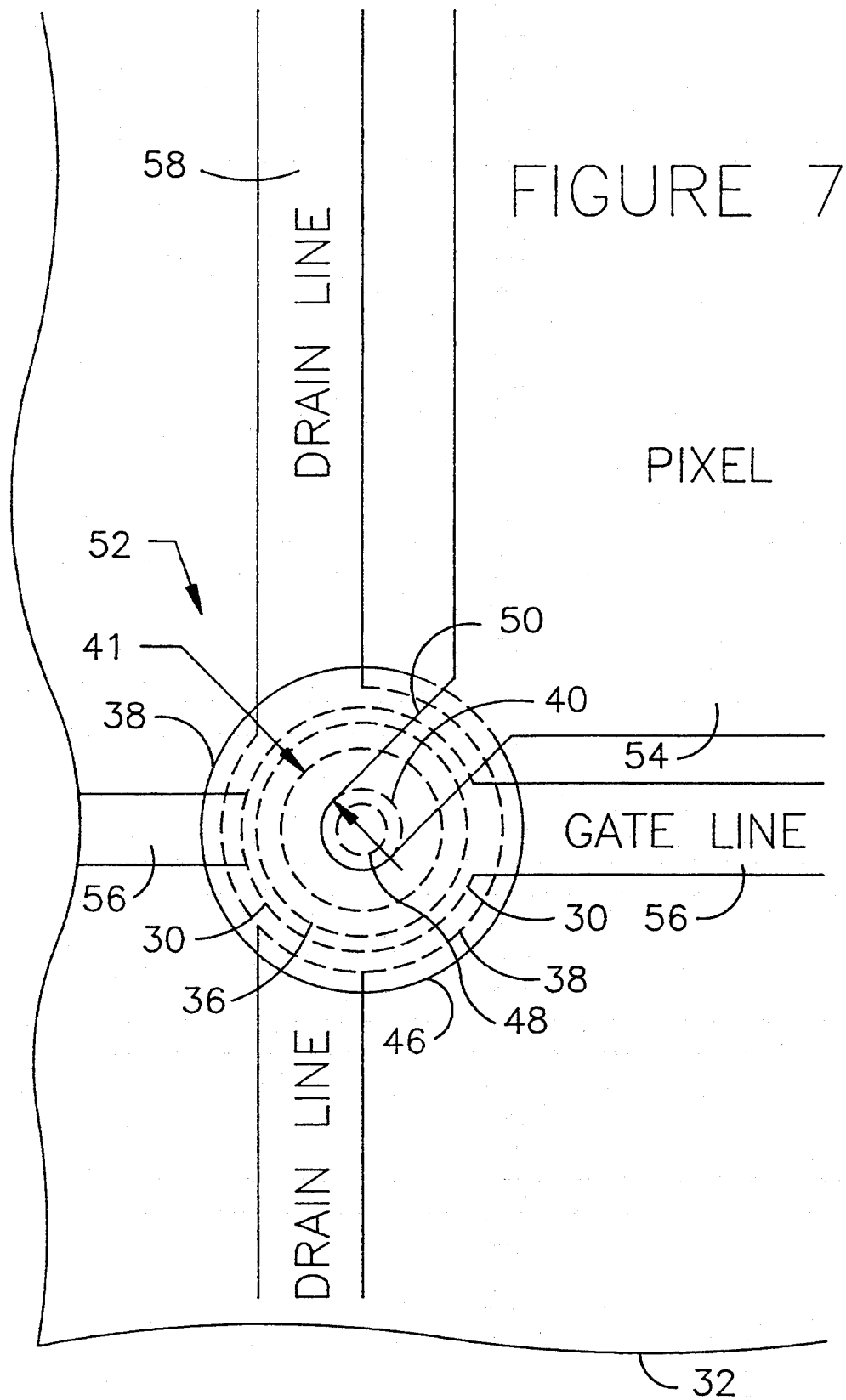
FIG. 7 is a top plan view of the first embodiment of the thin film transistor of this invention illustrating the pixel and data lines of FIG. 6.

As shown in FIGS. 6 and 7, a plurality of thin film transistors 52 of the first, second, or third embodiments of this invention are arranged on the transparent insulating substrate 32 in the form of a matrix, and are used as switching devices for corresponding liquid crystal display pixels 54 wherein each pixel display 54 includes a liquid crystal layer, opposing polarizers and a pair of opposing electrodes (one of which is the pixel electrode 50). More specifically, a plurality of TFTs 52 are arrayed on the transparent substrate in the column and row directions. Gate electrodes 30 of the respective thin film transistors are commonly electrically connected to conductive gate lines 56 in the row direction. Drain electrodes 38 of the respective TFTs 52 are commonly electrically connected to conductive drain lines 58 in the column direction. Source electrodes 40 of TFTs 52 are connected to the transparent pixel electrodes 50, which extend from their respective pixel displays 54 to the thru-holes 48 thereby being electrically connected to both the source electrodes 40 and pixel displays 54. Pixel displays 54 are respectively arranged in a plurality of regions surrounded by the gate and drain lines 56 and 58, and are electrically independent from one another. The edges of the pixels 54 are preferably located closely adjacent the gate and drain lines, and may even slightly overlap them.

Referring still to FIGS. 6 and 7, an opposite transparent substrate 60 (preferably on the viewer side of the AMLCD) having a corresponding transparent pixel electrode 62 formed on its entire surface is placed on the substrate 32 on which thin film transistors 52 are arranged in the form of a matrix in the above-described manner so as to oppose them. A liquid crystal display device is obtained by sealing liquid crystal material 64 between the opposing substrates 60 and 32. In this liquid crystal display device, each transparent pixel electrode 50 corresponds to one image displaying pixel or picture element of the active matrix liquid crystal display.

The above-described active matrix liquid crystal display device is operated in the following manner. Scan signals are sequentially supplied to the plurality of gate lines 56. Data signals for controlling the ON/OFF states of the respective pixels 54 are supplied to the plurality of drain lines 58 in accordance with the timing of the scan signals. Thin film transistor 52 whose gate electrode 30 has received a scanned signal is turned ON, reads a data signal supplied at that timing, and thereafter supplies the data signal via a voltage to the pixel electrode 50 and a resulting electric field is applied to the liquid crystal material 64 located between the pixel electrode 50 which has received the data signal and the transparent electrode 62 of the opposite substrate 60 in accordance with a potential difference between the opposite electrodes. Then, the orientation state of the molecules of the liquid crystal material 64 is changed, and thus transmission and interception of light are controlled according to the polarizers (not shown).

As described above, in the liquid crystal display of this embodiment having pixel electrodes formed on thin film transistors, the passivation insulating film 46 of a particular TFT is formed on at least a drain electrode 38 of the TFT, and the transparent pixel electrode 50 is formed on the resultant structure. Therefore, short circuiting between the transparent pixel electrode 50 and the drain electrode 38 can be prevented. In addition, due to the location of the thin film transistor of this embodiment at the intersection of the drain and gate lines of the matrix array, the distance between the pixel display and the drain and gate lines, i.e. distance A in FIG. 1, can be set close to 0 in the practice of this invention, thereby enlarging the pixel display area. Accordingly, a maximum effective pixel display area is obtained. In this embodiment, a pixel display opening ratio of about 53.5% or more can be realized as opposed to that of about 50% in conventional linear TFT devices, such as that shown in FIG. 1.

Because the step of forming the transparent pixel electrode 50 is the last one, and the source electrodes of all the arrayed TFTs are commonly connected upon deposition of the transparent conductive film before the step of separating the transparent electrodes 50 individually is executed, operations of all the TFTs can be measured within a short period of time by bringing the probe of a measuring device into contact with a plurality of gate and drain lines and the transparent conductive film while supplying test signals.

Figure 8:
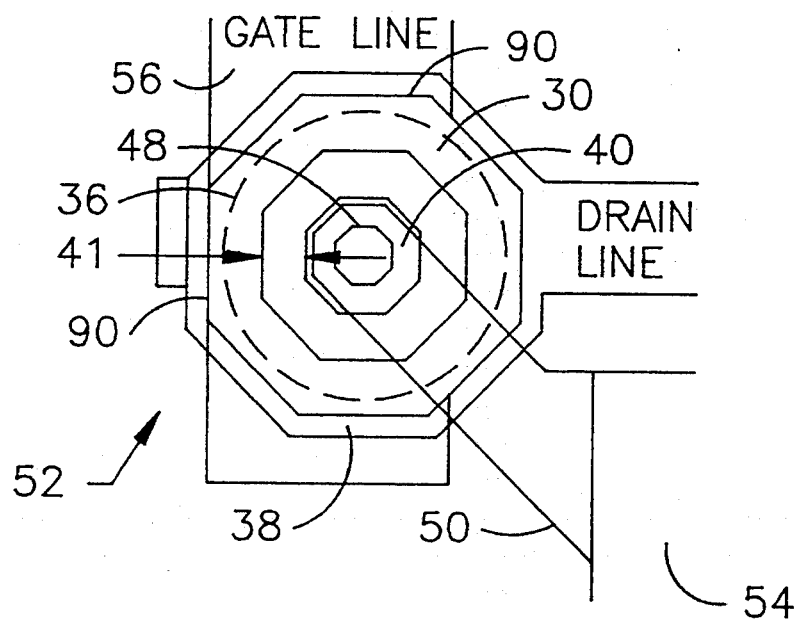
FIG. 8 is a top plan view of a second embodiment of the thin film transistor of this invention.
Figure 9:
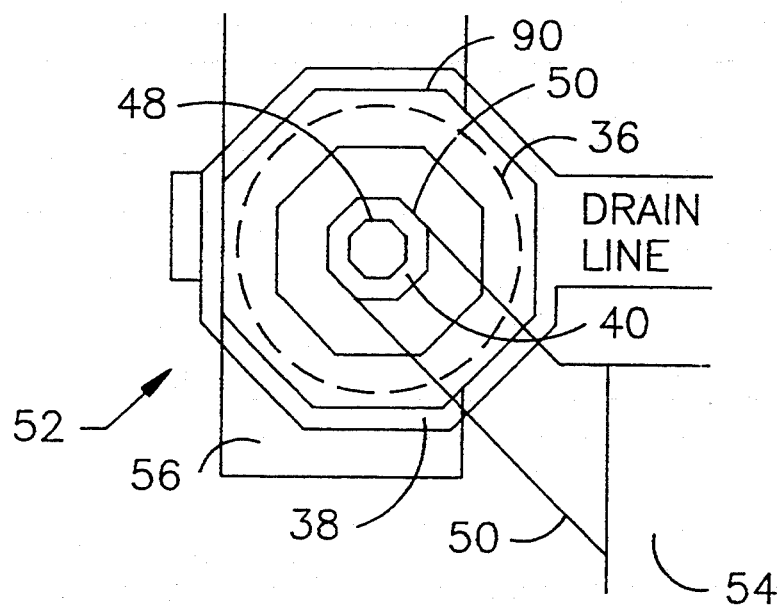
FIG. 9 is a top plan view of a third embodiment of the thin film transistor of this invention.

FIGS. 8 and 9 illustrate second and third embodiments of the ring-TFT of this invention. FIG. 8 is a top view illustrating an octagonal source electrode 40 completely surrounded by a substantially annular octagonal drain electrode 38. The diameter of the source electrode 40 shown in FIG. 8 is about 10 micrometers before etching and about 8 micrometers after etching of the electrode material. The channel length 41 of the TFT shown in FIG. 8, as in all of the TFTs illustrated in FIGS. 5-11 herein, is about 4 micrometers before etching and about 6 micrometers after etching. The channel width W (see FIG. 10) as in all the TFTs illustrated in FIGS. 5-11 herein, may be determined via conventional mathematical formulations.

FIG. 9 illustrates a thin film transistor similar to the second embodiment illustrated in FIG. 8 described above, except that the source electrode 40 has an island diameter of about 8 micrometers before etching and about 6 micrometers after etching. As can be seen in FIG. 9, the width of the pixel electrode 50 is substantially similar to the diameter of source electrode 40 in contrast to the embodiment of FIG. 8 where the width of the pixel electrode 50 is slightly less than the diameter of source electrode 40. Alternatively, the TFTs of FIGS. 8 and 9, instead of being octagonal, could be elliptical, hexogonal, circular, or rectangular. The reference numeral 90 is the photoresist pattern used to pattern the a-Si semiconductor layer, and 36 is the resulting a-Si layer.

The resulting semiconductor layer 36 in FIGS. 8-9 has an outer lateral edge about 0.5-2.0 μm inward from the outer lateral edge of the gate electrode.

Figure 10:
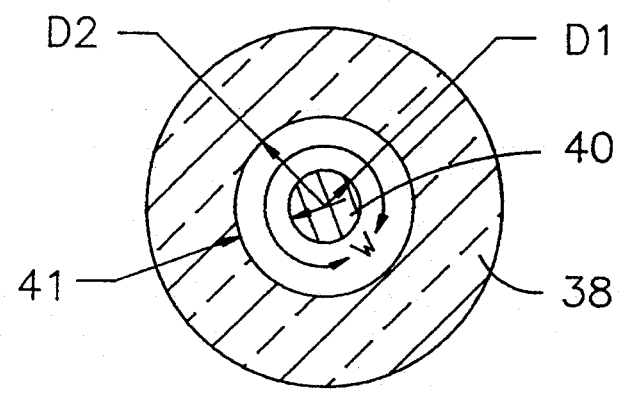
FIG. 10 is a top cross-sectional view of the source and drain electrodes of the first embodiment of the thin film transistor of this invention illustrated in FIG. 5.

FIG. 10 is a top cross-sectional view illustrating the cross-sections of the source electrode 40 and drain electrode 38 of the first embodiment of this invention illustrated in FIGS. 5-7. As can be seen in FIG. 10, the annular or circular drain electrode 38 completely surrounds centrally located round source electrode 40. Because the channel portion 41 between the source and drain electrodes is formed so as to completely surround the centrally located source electrode 40, the channel width W is sufficiently larger than the channel length L. Therefore, the L/W ratio of the channel length L to the channel width W is substantially less than one. Because of the geometric design of the TFT of this embodiment of this invention, the gate source parasitic capacitance $C_{GS}$ can be made small compared to the capacitance generated between one pixel electrode 50 and the opposing pixel electrode 62 through the liquid crystal material 64. Therefore, the influences of gate signals on source potentials can be reduced thereby reducing flickering of the pixel. Because the channel width W can be increased, high drive performance of this TFT can also be realized. By reducing the parasitic capacitance, the small DC components across the pixel can be substantially eliminated and flickering, image retention, and gray scale nonuniformity can be greatly reduced, if not eliminated.

The parasitic capacitance $C_{GS}$ of the ring type TFT of the first embodiment of this invention is defined by the following equation:

$$C_{GS\,(max)} = \pi D1^2 \ln\left(\frac{D2}{D1}\right) C_{OX}$$

As can be seen from this equation, variables D1 and D2 (see FIG. 10), D1 being the radius of the central round source electrode 40 and D2 being the inner radius of the drain electrode 38, determine the parasitic capacitance of the thin film transistors of this invention. By varying D1 and D2 (changing the size of the drain and/or source electrodes) one may fine tune the parasitic capacitance of a given TFT to a desired value. The parameter $C_{OX}$ simply represents the gate insulative capacitance per unit area.

Figure 3:
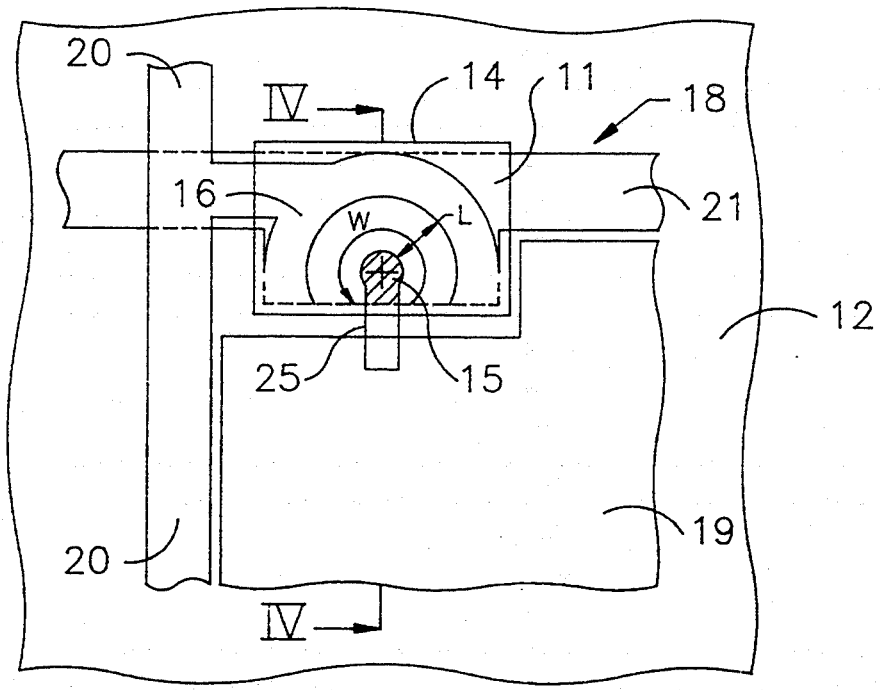
FIG. 3 is a top view showing the structure of an open-ring prior art thin film transistor which utilizes a round source and a semi-annular drain electrode only partially surrounding the source electrode.
Figure 4:
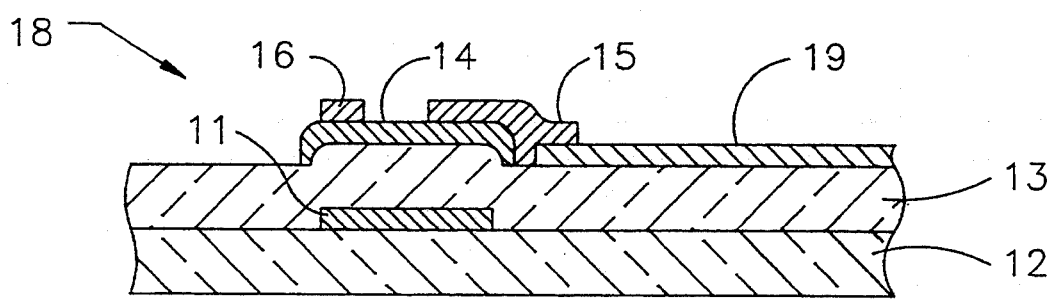
FIG. 4 is a cross-sectional view showing the open-ring thin film transistor shown in FIG. 3, taken along the line IV—IV in FIG. 3, illustrating the layering system of the prior art thin film transistor.

The thin film transistors of the above-described embodiments of this invention also have a substantially reduced photosensitivity. Backlighting assemblies (not shown) of active matrix liquid crystal displays are positioned below substrate 32 and emit intense radiation onto the pixel including the TFT. Because of the design of the TFTs of the above-described embodiments of this invention, wherein the transparent pixel electrode 50 crosses over the drain electrode 38, the pixel electrode 50 is shielded by the source, gate and drain electrodes from the heat and radiation generated by the backlighting assembly. Furthermore, the amorphous silicon layer 36 is photosensitive and needs to be shielded from the backlight by the gate electrode. In these embodiments, the a-Si semiconductor layer 36 does not extend to the lateral periphery of the gate electrode 30 and is therefore not exposed to the backlight radiation as in the aforesaid discussed prior art TFTs. Accordingly, the TFT of these embodiments are less photosensitive. Therefore, the TFTs of this invention also have the advantage, relative to the open ringed TFT shown in FIGS. 3-4, of having a reduced photosensitivity due to the geometric design of the semiconductor layer, the gate electrode, and the crossover aspect of the pixel electrode crossing over the drain electrode. The gate electrode 30 has a larger horizontal surface area than the semiconductor layer and therefore effectively shields the photosensitive semiconductor layer from the backlight radiation.

The thin film transistor of the above-described embodiments of this invention is not as susceptible to misalignment as prior art TFTs. The reason for this, as can be seen in FIG. 5, is that the source and drain electrodes may be moved left or right about 1-3 micrometers ($\mu$m) without vacating the peripheral area of the gate electrode 30. Therefore, the TFTs of particular embodiments of this invention have an increased margin for misalignment in the manufacturing process. The prior art TFTs shown herein in FIGS. 1-4 have no such tolerance for misalignment.

Figure 11:
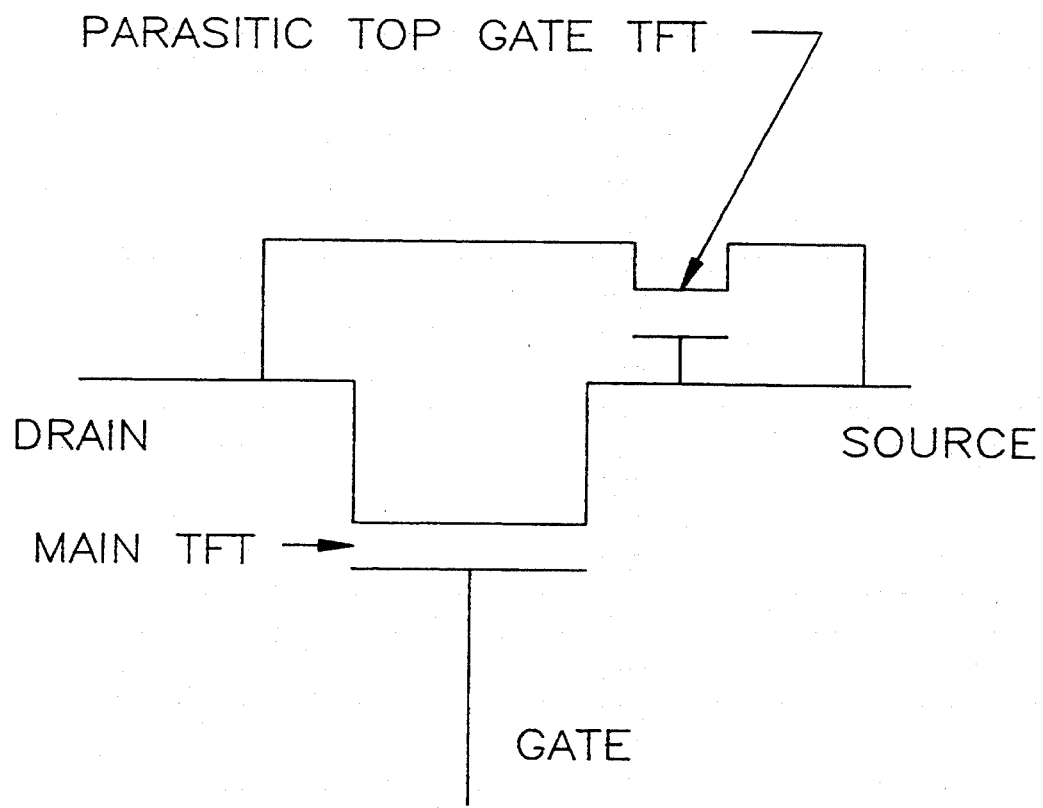
FIG. 11 is an equivalent circuit diagram of a thin film transistor of this invention.

The above mentioned top gate thin film transistor formed by the crossover 51 of the pixel electrode 50 over the annular channel 41 will be discussed as follows. Where the portion 51 of pixel electrode 50 crosses the channel 41, a small top gate transistor is formed with the passivation insulator layer 46 acting as the gate dielectric. The equivalent circuit for this configuration is shown in FIG. 11. Only when $V_{SD}$ (the voltage between the source and drain discussed in the examples below) is positive and larger than the threshold voltage of this top gate transistor, is an accumulation layer formed at the interface of the passivation layer 46 and the semiconductor layer 36, and an excess leakage current is observed. This parasitic top gate TFT has a substantially higher threshold than the main ring TFT formed by source 40, drain 38, semiconductor 36, and gate 30. During normal operations of TFTs in an active matrix liquid crystal display, the highest $V_{SD}$ is about 10 volts. At this $V_{SD}$ the ring TFT of the above-described embodiments of this invention can be shut off by a $V_{GS}$ of about $-5$ volts, and the top parasitic transistor is not an inhibitor. In other words, the OFF current (discussed below in the examples) behaves normally for negative voltage and normal positive voltage (e.g. about 10 volts) on the source electrode. However, for larger positive voltages on the source electrode (e.g. about 20 volts) increased OFF current is observed. Because, during normal operations of typical active matrix liquid crystal displays, the positive voltage on the source is maintained at about 10 volts, the parasitic top gate transistor formed by the crossover 51 of the pixel electrode 50 over the channel 41 is not detrimental to the operation of the TFT of the above-described embodiments of this invention.

It should be clear that the TFTs of the above-described embodiments may be further optimized as needed by increasing the threshold voltage ($V_{th}$) of the parasitic top gate TFT by, for example, proper choice of passivation layer material, interface treatments, and increasing the thickness of the passivation layer.

A possible modification to the thin film transistor of the above-described embodiments of this invention will be described as follows. A contact metal (not shown) consisting essentially of a conductive metal material may be buried in the through hole 48 formed above the source electrode 40, and the transparent pixel electrode 50 may then be deposited on the resultant structure, thereby electrically connecting the source electrode 40 to the transparent pixel electrode 50. The contact metal may include, for example, nickel, gold, silver, chromium, or the like and is formed in the through hole 48 by electrolysis plating. In this modification, the source and pixel electrodes 40 and 50 are connected to one another through the contact metal (not shown). Hence, electrical connection therebetween may be ensured. This modification allows simpler electrical connection of the pixel and source electrodes and is especially useful when the thickness of the passivation layer 46 is increased above about 400-500 Å.

A second possible modification of the ring-shaped TFT of the above-described embodiments of this invention is as follows. The above-described illustrated embodiments of this invention show the passivation insulator layer 46 having a substantially constant thickness across each of the source electrode 40, the semiconductive layer 36, and the drain electrode 38. Alternatively, the passivation layer 46 may be deposited on the above-described films so as to define an upper surface thereof being substantially flat. This would allow the pixel electrode 50 to be deposited onto a flat upper surface of the passivation layer 46, thereby allowing the transparent pixel electrode to be more easily and simply deposited onto the passivation layer.

FIG. 12 illustrates a pixel display 54 of this invention to which the pixel electrode 50 is electrically connected. The pixel electrode 50 extends between the pixel 54 and the source electrode 40 of a TFT of this invention. An opposing pixel electrode 62 is disposed on the opposite side of the liquid crystal layer 64 and is mounted on the lower substrate 60. Polarizers 71 and 72 are on opposite sides of the pixel and may be crossed or parallel thereby creating either a normally white or normally black display. Orientation films 74 and 75 align the LC material 64 adjacent the films 74 and 75 in predetermined directions (preferably at angles perpendicular to one another) thereby preferably creating a twisted nematic liquid crystal cell. The color filter may be, for example, red, green, or blue. The pixel 54 shown in FIG. 12 is merely one pixel or subpixel in the array of LCD pixels 54 shown in FIG. 6.

This invention will now be described with respect to certain examples as follows:

EXAMPLES

Four exemplary thin film transistors were manufactured and tested as follows: the first and second TFTs ("Type A" and "Type B") were ring-shaped thin film transistors according to this invention. The third ("open-ring TFT") was similar to the first two except that a portion of the drain electrode was removed so that the pixel electrode did not cross over the drain electrode or a channel portion formed between the source and drain, thereby simulating the open-ring TFT shown in prior art FIGS. 3-4. The fourth ("linear TFT") was a conventional linear type TFT similar to that illustrated in FIGS. 1 and 2 with a layering system similar to those of "Type A" and "Type B".

EXAMPLE 1

The first TFT formed according to this invention, "Type A", was formed as follows. This TFT had a cross-sectional view similar to that illustrated in FIG. 5, having a lower insulating substrate upon which a gate electrode, a dual layered gate insulating layer, a semiconductor layer, a contact layer, source and drain electrodes, a passivation insulator layer, and a transparent pixel electrode were formed. The source electrode was round having a diameter of 6 $\mu$m and the drain electrode was circular or annular and completely surrounded and was partially substantially co-planar with the source electrode. The lateral edges of the a-Si semiconductor layer did not extend to the periphery of the gate electrode. The channel length was 6 micrometers. The semiconductor layer was formed of amorphous silicon and was 2,000 Å thick. The gate insulating layer was a dual layered system with a 1,600 Å thick TaO layer and a 2,000 Å thick silicon nitride layer. The temperature was 26° C. The gate electrode was about 2,500 Å thick and the source and drain electrodes were about 4,000 Å thick. Table 1 below illustrates the resultant ON and OFF currents as well as the parasitic capacitance $C_{GS}$ of this "Type A" ring-shaped TFT.

TABLE 1

| "Type A" Ring TFT | |
|---|---|
| $I_{ON}(+)$ (μA) | 10.1 |
| $I_{ON}(-)$ (μA) | 7.42 |
| $I_{OFF}(+)$ (pA) | 0.5 |
| $I_{OFF}(-)$ (pA) | 0.09 |
| $C_{GS}$ (min) (fF) | 33 |
| $C_{GS}$ (max) (fF) | 47 |

$I_{on}(+)$ was measured with $V_G = 20$ V, $V_S = 10$ V, and $V_D = 0V$.

The "+" refers to positive $V_{SD}$, and the "−" refers to the probes being switched on the source and drain electrodes.

$I_{OFF}$ was at $V_{GS} = -5$ V, $V_S = 10$ V, and $V_D = 0V$.

$C_{GS}$ (min) was the parasitic capacitance when the TFT was OFF, and $C_{GS}$ (max) is the parasitic capacitance when the TFT was ON. $C_{GS}$ was measured as a function of $V_{GS}$ with a Keithly 3330 LCZ meter. The meter had a resolution of $10^{-15}$ F (1 fF).

EXAMPLE 2

A second ring-shaped thin film transistor ("Type B") according to this invention was formed as follows.

The "Type B" TFT of this example also had a cross-section similar to that illustrated in FIG. 5. The channel length was 6 micrometers. The layering system and respective thicknesses thereof were similar to those described above in Example 1, but the temperature was 27° C. The principal difference between the TFT of this example and that of Example 1 was that the source electrode of this example was round and had a diameter of 8 micrometers. Therefore, while similar TFTs were made in Examples 1 and 2, the principal difference is that the central round source electrode of Example 2 had a diameter about 2 micrometers larger than that of Example 1. Both TFTs of Examples 1 and 2 had round centrally located source electrodes and circular or annular drain electrodes completely surrounding the source electrodes. Table 2 below illustrates the current, voltage, and parasitic capacitance characteristics of the "Type B" TFT of Example 2.

TABLE 2

| "Type B" ring-shaped TFT | |
|---|---|
| $I_{ON}(+)$ (μA) | 13.9 |
| $I_{ON}(-)$ (μA) | 11.2 |
| $I_{OFF}(+)$ (pA) | 1.15 |
| $I_{OFF}(-)$ (pA) | 1.47 |
| $C_{GS}$ (min) (fF) | 40 |
| $C_{GS}$ (max) (fF) | 60 |

The above-listed parameters of Table 2 were determined using the voltages and probes listed in Table 1.

EXAMPLE 3

A partial ring-shaped TFT ("open-ring TFT") was formed as follows. The "open-ring TFT" was formed in a manner identical to the "Type B" TFT of Example 2 except that the drain electrode was horseshoe shaped with the source-drain metal removed under the cross-over bridge 51 illustrated in FIG. 5. Although this "open-ring TFT" did not have a drain which completely or substantially surrounded the source, its drain electrode surrounded the source to an extent greater than that shown in FIGS. 3-4 herein. The temperature was 27° C. Table 3 below illustrates the current voltage, and parasitic capacitance characteristics of the "open-ring TFT" of Example 3.

TABLE 3

| "Open-Ring TFT" | |
|---|---|
| $I_{ON}(+$ (μA) | 10.7 |
| $I_{ON}(-)$ (μA) | 9.4 |
| $I_{OFF}(+)$ (pA) | 1.6 |
| $I_{OFF}(-)$ (pA) | 0.18 |
| $C_{GS}$ (min) (fF) | 45 |
| $C_{GS}$ (max) (fF) | 76 |

The above-listed parameters of Table 3 were determined using the voltages and probes listed in Table 1.

EXAMPLE 4

Figure 1:
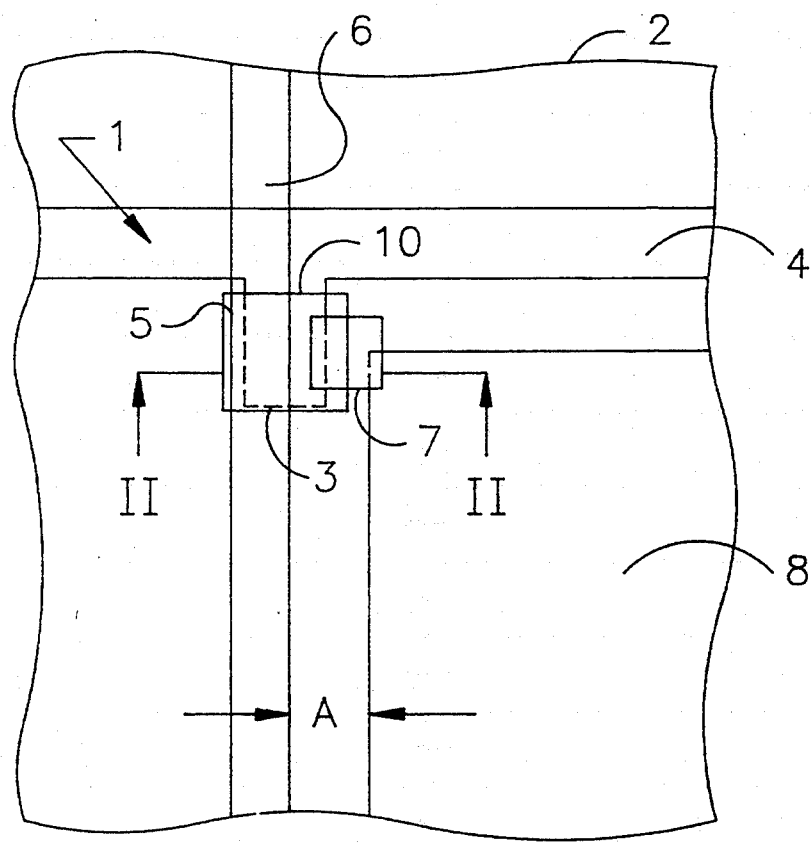
FIG. 1 is a top view of the construction of a prior art active matrix liquid crystal display utilizing a conventional linear type thin film transistor having a relatively high parasitic capacitance and high photosensitivity.
Figure 2:
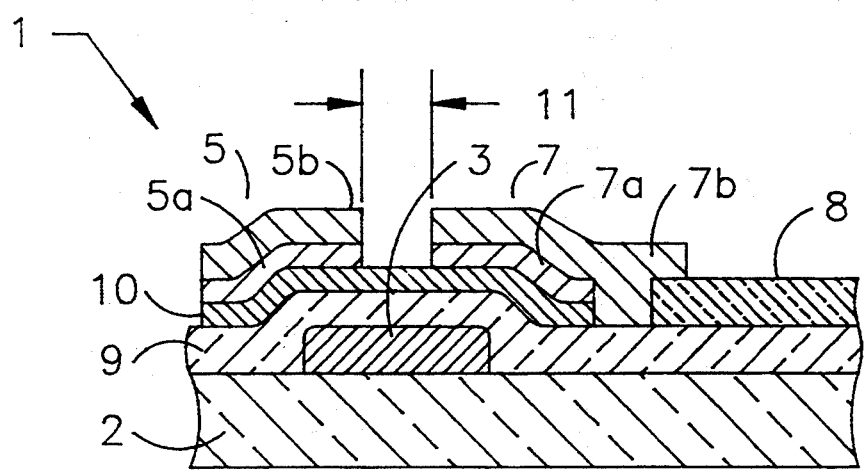
FIG. 2 is a cross-sectional view illustrating the linear thin film transistor of FIG. 1 taken along line II—II in FIG. 1, illustrating the layering system of the prior art linear type thin film transistor.

A "linear TFT" similar to that shown in FIGS. 1-2 was made and tested as follows. This linear TFT had a cross-section including a lower insulating substrate upon which a gate electrode, a dual layered gate insulating layer, a semiconductor layer, a contact layer, source and drain electrodes, a passivation insulator layer, and a transparent pixel electrode were formed. The channel length was 6 μm and the channel width was 36 μm. The semiconductor layer was of a-Si and was 2,000 Å thick. The temperature was 29° C. The gate insulating layer included a 1,600 Å thick TaO layer and a 2,000 Å thick SiN layer. Table 4 below illustrates the resultant ON and OFF currents as well as the parasitic capacitance $C_{GS}$ of this "linear TFT."

TABLE 4

| "linear TFT" | |
|---|---|
| $I_{ON}(+)$ (μA) | 12.4 |
| $I_{ON}(-)$ (μA) | 12.3 |
| $I_{OFF}(+)$ (pA) | 0.09 |
| $I_{OFF}(-)$ (pA) | 0.09 |
| $C_{GS}$ (min) (fF) | 65 |
| $C_{GS}$ (max) (fF) | 115 |

The above-listed parameters of Table 4 were determined using the voltages and probes listed in Table 1.

Table 5 below compares the current and parasitic capacitance of the four TFTs of Examples 1-4.

TABLE 5

| "comparative results" | | | | |
|---|---|---|---|---|
| | "Type A" | "Type B" | "open ring TFT" | "linear TFT" |
| $I_{ON}(+)$ (μA) | 10.1 | 13.9 | 10.7 | 12.4 |
| $I_{ON}(-)$ (μA) | 7.42 | 11.2 | 9.4 | 12.3 |
| $I_{OFF}(+)$ (pA) | 0.5 | 1.15 | 1.6 | 0.09 |
| $I_{OFF}(-)$ (pA) | 0.09 | 1.47 | 0.18 | 0.09 |
| $C_{GS}$ (min) | 33 | 40 | 45 | 65 |

TABLE 5-continued

| | "comparative results" | | | |
|---|---|---|---|---|
| | "Type A" | "Type B" | "open ring TFT" | "linear TFT" |
| (fF) | | | | |
| $C_{GS}$ (max) (fF) | 47 | 60 | 76 | 115 |

As shown in Table 5 above, the TFTs of particular embodiments of this invention ("Type A" and "Type B") have parasitic capacitance $C_{GS}$ significantly lower than those of the "linear TFT" and the "open-ring TFT". The "Type A" TFT has the lowest $C_{GS}$, but its ON current is reduced relative to that of "Type B". Therefore, "Type B" has the best performance with about a 22% reduction in $C_{GS}$ (max) relative to the "open ring" and almost a 50% reduction in $C_{GS}$ (max) relative to the "linear TFT", while sacrificing only about 10% in ON current $I_{ON}(-)$ relative to the "linear TFT" and having about a 15–20% increase in ON current relative to the "open ring TFT". The ON current $I_{ON}(-)$ is the ever important parameter used in determining how fast the pixel will charge up during the positive charging cycle. $C_{GS}$ (max), the gate source capacitance in the TFT ON state, determines the pixel voltage drop or shift after switching off the gate.

As can be seen from the above, the TFTs of particular embodiments of this invention ("Type A" and "Type B") are clearly superior to both the conventional "linear TFT" and the "open ring TFT". This is because the TFTs of particular embodiments of this invention have a decreased parasitic capacitance relative to the "linear TFT" and "open ring TFT" and preferably an increased ON current relative to the "open-ring TFT."

Once given the above disclosure, many other features, modifications, and improvements will become apparent to the skilled artisan. Such other features, modifications, and improvements are, therefore, considered to be a part of this invention, the scope of which is to be determined by the following claims.

We claim:

1. A pixel for use in a liquid crystal display, comprising:
a layer of liquid crystal material sandwiched between two spaced substrates, one of said substrates having a pixel electrode mounted thereon which defines a pixel surrounded by, ate and drain lines, wherein said pixel electrode is electrically connected to a thin film transistor, said thin film transistor comprising:
a drain electrode adapted to be electrically connected to said drain line; a gate electrode adapted to be electrically connected to said gate line; and a source electrode electrically connected to said pixel electrode; wherein said source electrode is located on a semiconductor film and is substantially completely surrounded in substantially all lateral directions by said drain electrode, and wherein said drain electrode is disposed between said source electrode and at least a substantial portion of said pixel electrode so that said transistor has a reduced parasitic capacitance.

2. The pixel of claim 1 wherein said drain electrode is substantially annular or circular defining an inner and outer diameter, and said source electrode is substantially round defining an outer diameter.

3. The pixel of claim 1 wherein said thin film transistor further comprises a passivation insulating layer formed on an upper surface of at least one of said drain and source electrodes, and said pixel electrode electrically connected to said source electrode is transparent and is adhered to and crosses over said passivation layer and said drain electrode.

4. The pixel of claim 3, wherein said transparent pixel electrode consists essentially of Indium-Tin-Oxide (ITO) and said passivation layer consists essentially of one of: silicon nitride, silicon oxide, and combinations thereof.

5. The pixel of claim 3, wherein said thin film transistor has a parasitic capacitance $C_{GS}$ (max) less than about 65 fF, and an ON current $I_{ON}(-)$ greater than about 7.0 $\mu A$ when $V_G=20$ volts, $V_S=0$, and $V_D=10$ volts.

6. The pixel of claim 5 wherein said thin film transistor has a parasitic capacitance $C_{GS}$ (max) less than or equal to about 60 fF, and an ON current $I_{ON}(-)$ greater than about 10.5 $\mu A$.

7. The pixel of claim 3, wherein said thin film transistor further comprises a gate insulating layer disposed between said semiconductor film and said gate electrode, wherein said gate insulating layer includes a silicon nitride layer and a TaO layer.

8. The pixel of claim 7, wherein said TaO layer is about 1,600 Å thick and said silicon nitride layer is about 2,000 Å thick.

9. In an active matrix liquid crystal display (AMLCD) comprising a plurality of thin film transistors arranged on an insulating substrate in the form of a matrix, at least one of said plurality of thin film transistors including a drain electrode electrically connected to a drain line, a gate electrode electrically connected to a gate line, and a source electrode electrically connected to a transparent pixel electrode of a corresponding picture element or pixel, wherein said source and drain electrodes of said at least one thin film transistor are formed on a semiconductor film and separated from one another by a channel defining a predetermined length and width, the improvement comprising:
wherein said source electrode of said at least one thin film transistor is centrally located on said semiconductor film and is substantially completely surrounded laterally by said drain electrode, and wherein said drain electrode is positioned between said source electrode and said picture element.

10. The display of claim 9 wherein said drain electrode is substantially annular or circular defining an inner and an outer diameter, and said source electrode is substantially round defining only an outer diameter.

11. The display of claim 9 wherein said gate line is arranged in a row direction, said drain line is arranged in a column direction substantially perpendicular to said gate line, and wherein said gate and drain lines intersect one another defining said pixel display area therebetween.

12. The display of claim 11 wherein said thin film transistor is located at the intersection of said gate and drain lines thereby enlarging the size of said pixel display area and wherein the picture element is disposed in the rectangular area defined between said gate and drain lines.

13. The display of claim 9 further comprising a passivation layer formed on an upper surface of at least one of said drain and source electrodes, and wherein a portion of said transparent pixel electrode crosses over said drain electrode and said passivation layer.

14. The display of claim 13 wherein said pixel electrode consists essentially of Indium-Tin-Oxide (ITO) and said passivation layer consists essentially of one of: silicon nitride, silicon oxide, and combinations thereof.

15. The display of claim 9 wherein said channel is ring-shaped, and said source is round having a diameter of about 5-12 μm.

16. The display of claim 9 wherein said semiconductor film consists essentially of amorphous silicon and is about 2,000 Å thick.

17. The display of claim 10 wherein said gate electrode is substantially round and has a diameter substantially larger than said inner diameter of said drain electrode thereby increasing the tolerance for misalignment of said source and drain electrodes relative to said gate electrode.

18. The display of claim 9 wherein said thin film transistor has a parasitic capacitance $C_{GS}$(max) less than about 65 fF, and an ON current, $I_{ON}(-)$, greater than about 7.0 μA when $V_G=20$ volts, $V_S=0$ volts, and $V_D=10$ volts.

19. The display of claim 18 wherein said thin film transistor has a parasitic capacitance $C_{GS}$(max) less than or equal to about 60 fF and an ON current $I_{ON}(-)$ greater than about 11.0 μA.

20. The pixel of claim 1, wherein the gate electrode, not including the gate line, has a larger horizontal surface area than the semiconductor layer.

21. The pixel of claim 20, wherein said semiconductor layer does not extend laterally on any side to the periphery of said gate electrode, and is thereby shielded by said gate electrode from radiation emitted from a backlighting means.

22. A liquid crystal display comprising:
a plurality of TFTs which act as switching elements for corresponding pixels, said TFTs being laterally spaced from the picture defining portions of said pixels; and
wherein each of said TFTs includes a gate electrode and a centrally located source electrode substantially surrounded by a drain electrode whereby said TFTs have reduced parasitic capacitances.

* * * * *